June 18, 1968 J. P. JONES, JR 3,389,308
UNIVERSAL SWITCHING LOGIC EMPLOYING LATCHING
RELAYS WITH TRANSITION DELAY PERIODS
Filed Jan. 3, 1964 7 Sheets-Sheet 1

INVENTOR
JOHN PAUL JONES JR

BY Watson, Cole, Grindle & Watson
ATTORNEYS

INVENTOR
JOHN PAUL JONES JR.
BY Watson, Cole, Grindle & Watson
ATTORNEYS

LOGIC RULES
"1" = GROUND, "0" = -12 V
TRANSFER = Δ (0—1)
TRIGGER = Δ (0—1)
SET & RESET M(0—1)
M = MOMENTARY

AN M(1)
PULSE

INVENTOR
JOHN PAUL JONES JR.

BY Watson, Cole, Grindle & Watson
ATTORNEYS

INVENTOR
JOHN PAUL JONES JR.
BY Watson, Cole, Grindle & Watson
ATTORNEY

UNIVERSAL SWITCHING LOGIC EMPLOYING LATCHING RELAYS WITH TRANSITION DELAY PERIODS

Filed Jan. 3, 1964 7 Sheets-Sheet 5

INVENTOR
JOHN PAUL JONES JR.
BY Watson, Cole, Grindle & Watson
ATTORNEYS

June 18, 1968 J. P. JONES, JR 3,389,308

UNIVERSAL SWITCHING LOGIC EMPLOYING LATCHING RELAYS WITH TRANSITION DELAY PERIODS

Filed Jan. 3, 1964 7 Sheets-Sheet 6

INVENTOR

JOHN PAUL JONES JR.

BY Watson, Cole, Grindle & Watson

ATTORNEYS

INVENTOR

JOHN PAUL JONES JR

BY Watson, Cole, Grindle & Watson

ATTORNEYS

United States Patent Office 3,389,308

Patented June 18, 1968

3,389,308

UNIVERSAL SWITCHING LOGIC EMPLOYING LATCHING RELAYS WITH TRANSITION DELAY PERIODS

John Paul Jones, Jr., Norristown, Pa., assignor to Navigation Computer Corporation, Norristown, Pa., a corporation of Pennsylvania Filed Jan. 3, 1964, Ser. No. 335,635
19 Claims. (Cl. 317—123)

ABSTRACT OF THE DISCLOSURE

Various logical configurations are disclosed operable with a basic logical element comprising a simple latching magnetic reed switch relay which is operated by A-C coupled pulses at respective ends of a coil in series with the latching contacts to either energize the coil for closing the latching contacts or to deenergize it long enough for its latching contacts to release. In some embodiments additional transfer contacts are provided for isolated memory access. This disclosure shows connections for the most commonly used logic operations in steering, shifting, one-shot, flip-flop and counting circuits.

This invention relates to electronic logic elements useful in digital processing circuits and more particularly, it relates to logic circuits employing relays with contact closures which provide isolated current carrying paths responsive to digital logic decisions.

Logical elements of the prior art have been found unsatisfactory in many cases where they have been employed universally. One significant problem is the worst case design of a logical element such as a diode, transistor or magnetic core which limits the number of output circuits to be driven to relatively few. Thus, the design of a system requires much more complexity, and the number of parts becomes so great as to limit the reliability. Temperature responses of such materials as germanium introduce critical operation conditions. Ability to handle power and provide isolated current paths is generally found wanting in the prior art. At times it is also desirable to handle high voltage switching directly, and this is not generally simple to do with semiconductor logical devices or magnetic cores. Also, mechanical or electronic noise factors may readily be introduced into many of these circuits without use of costly filters.

Relay logic circuits have not come into general logical use heretofore because of the extreme complexity of such circuits caused by the need to design logic to prevent sneak circuits, time races and the lack of efficient circuits for providing delays and gating functions. Also, in general, complex logic with relays has been accomplished only at very low speeds.

In performing logic many of the prior art elements are not compatible with universal use. Some do not efficiently operate when used as building blocks in various sorts of logical operation, others do not provide continuous static storage which can be sampled at any time, thus leading to complex readout circuits and extensive auxiliary pulse timing and sequential driving circuits.

Accordingly, it is a general object of the invention to provide relay type universal logic elements which overcome these problems.

A further object of the invention is to provide simple, reliable and inexpensive logic elements.

Another object of the invention is to provide logic systems which are operable in the presence of random transient electrical noise impulses and other noise conditions.

A still further object of the invention is to provide a logic element suited for use in all the basic functional circuit embodiments.

Yet another object of the invention is to provide a series of more sophisticated logical operations built up from using combinations of the logical elements, wherein the number of components in such circuits are significantly decreased, thus affording low cost and high reliability.

It is an objective of the invention to produce a logical element capable of driving a large number of similar elements such as twenty, or useful in driving power loads directly, thereby having significant power amplification.

The logical element comprises a simplified relay utilizing hermetically sealed magnetic reed switches. Inherent operational characteristics of this relay are employed to perform logical functions to the substantial exclusion of driving amplifiers, noise filtering networks, isolation circuits and delay means. In essence, the logical element is a storage device operating as a latching relay. The inherent delays encountered in closing and breaking relay contacts are an essential part of the logic, which performs the more sophisticated basic functions of storage, delay lines, flip-flop action, steering gates, binary counting, and thus results in simplified reversible counters, binary-decimal counting and shift register embodiments.

Various features of the invention are described hereinafter in more detail with reference to the accompanying drawings, wherein.

Figure 9:
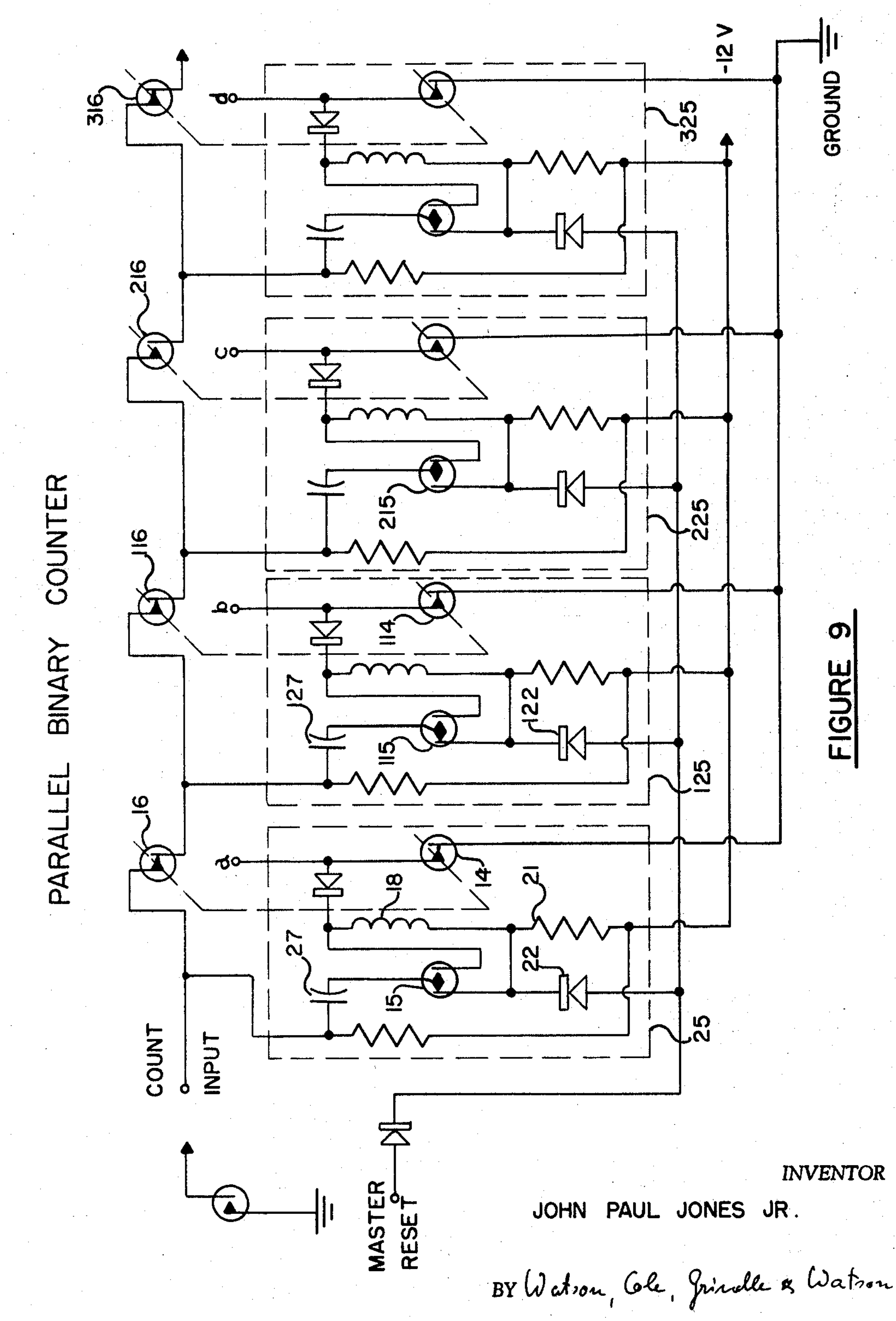
Figure 10:
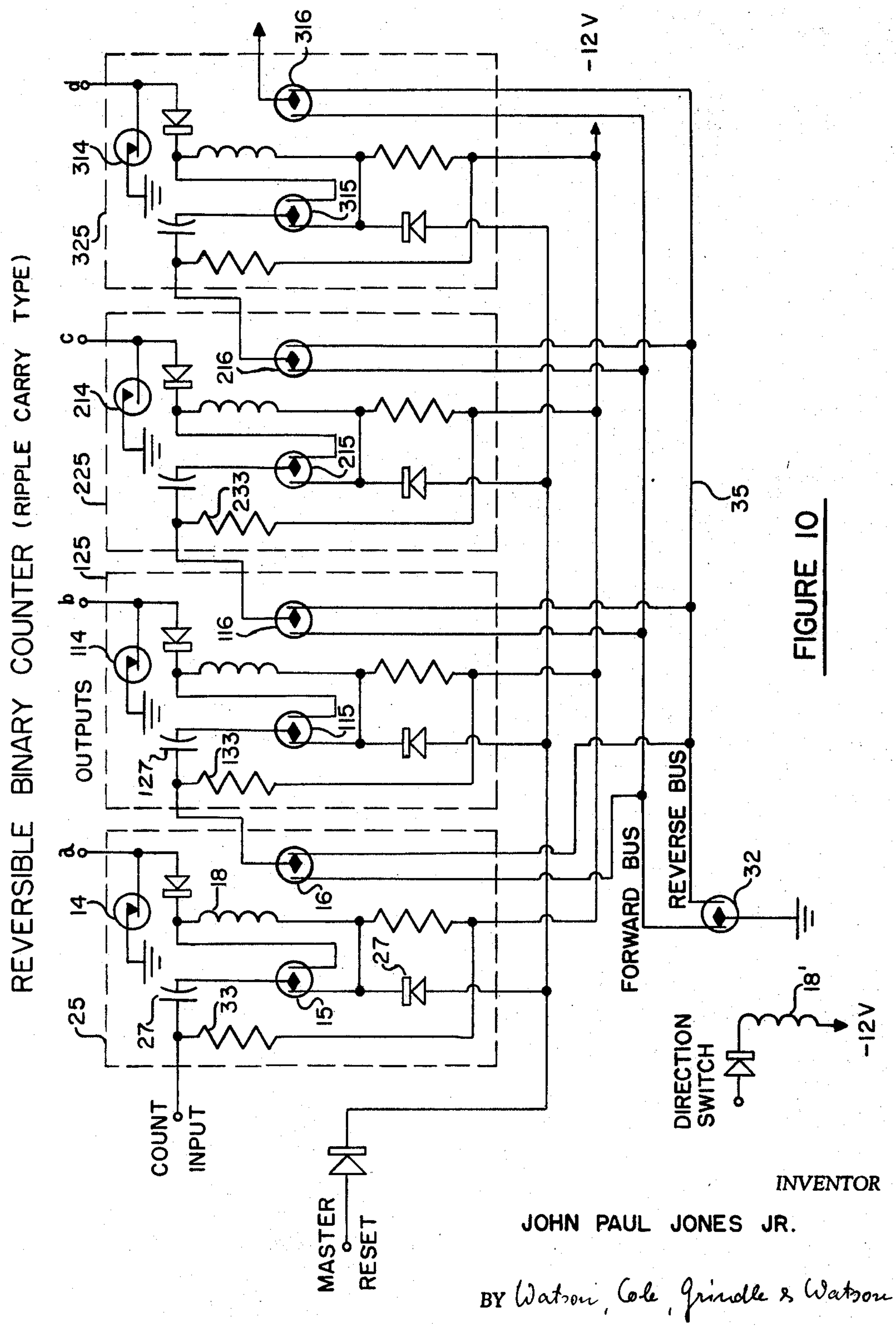
Figure 11:
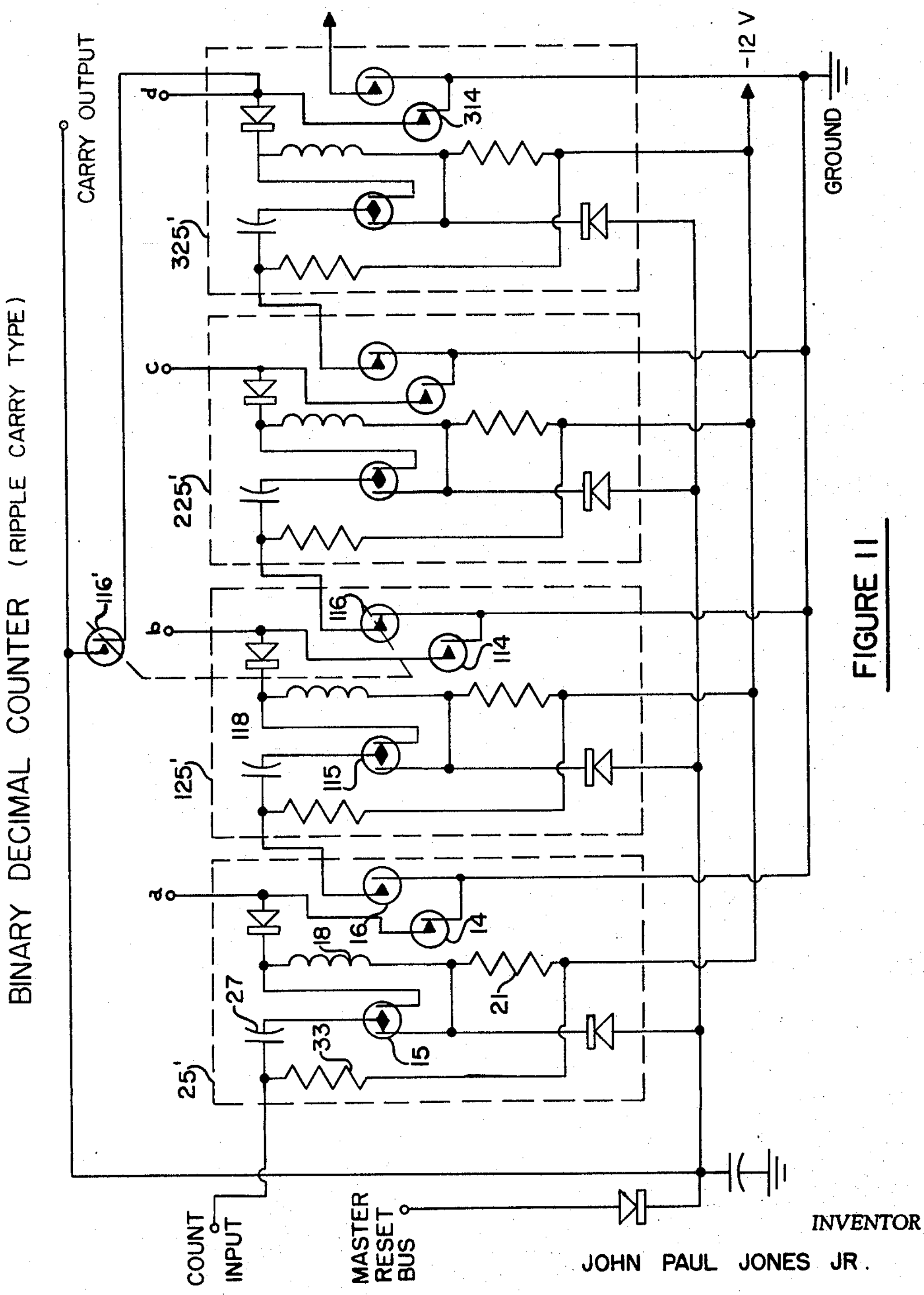
Figure 12:
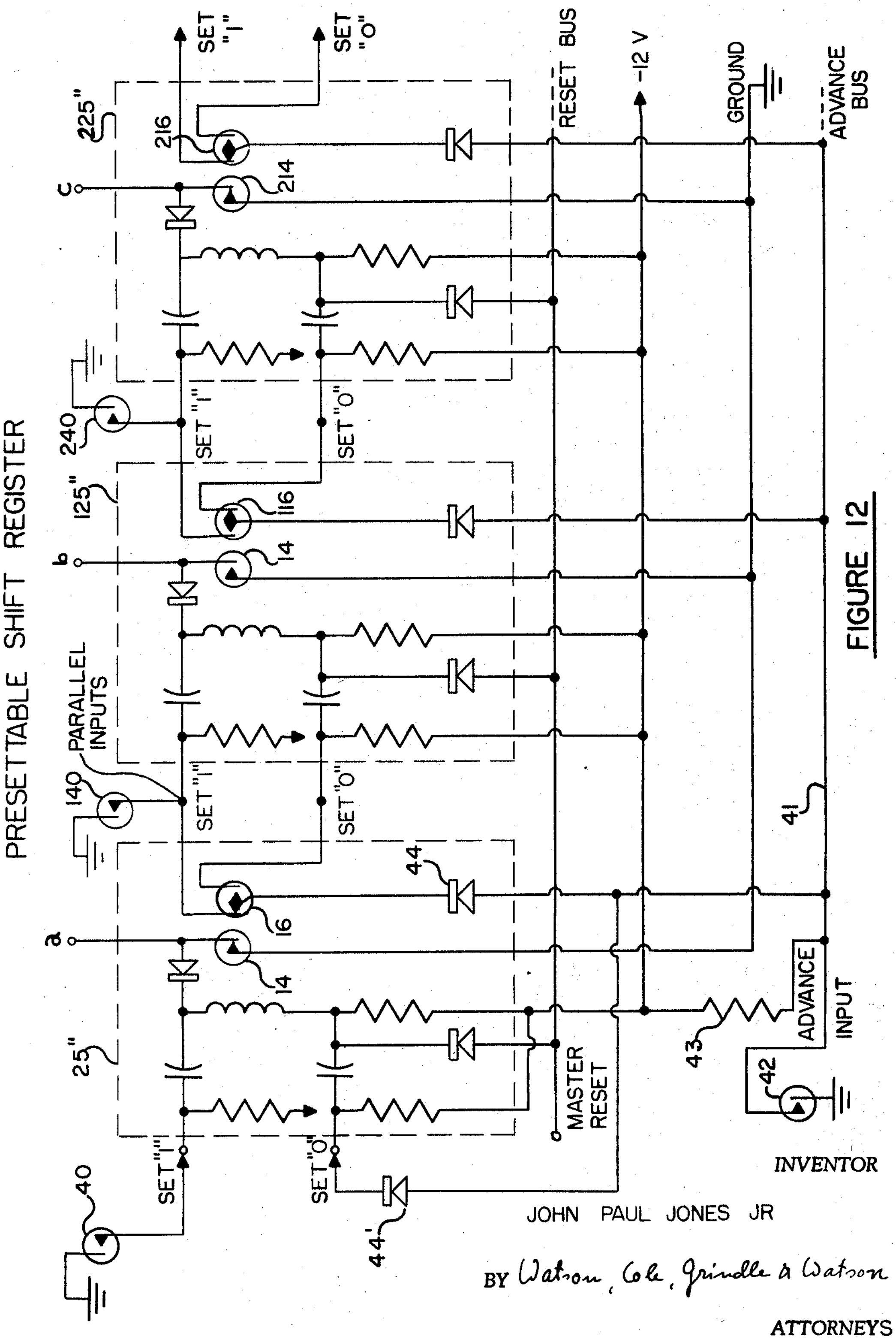

FIGURES 8A to F are several circuit configurations typifying various logic circuits constructed in accordance with the invention;

FIGURE 9 is a parallel binary counter circuit configuration of the invention;

FIGURE 10 is a reversible binary counter circuit configuration of the invention;

FIGURE 11 is a binary-decimal counter circuit configuration of the invention; and FIGURE 12 is a presettable shift register circuit configuration of the invention.

Throughout the views the reference characters will be related to identify the same basic structure, and thus, 110, 210, etc. will comprise an element 10 used in a sequence with other similar elements. Primed reference characters are used to illustrate modified components.

Figure 1:
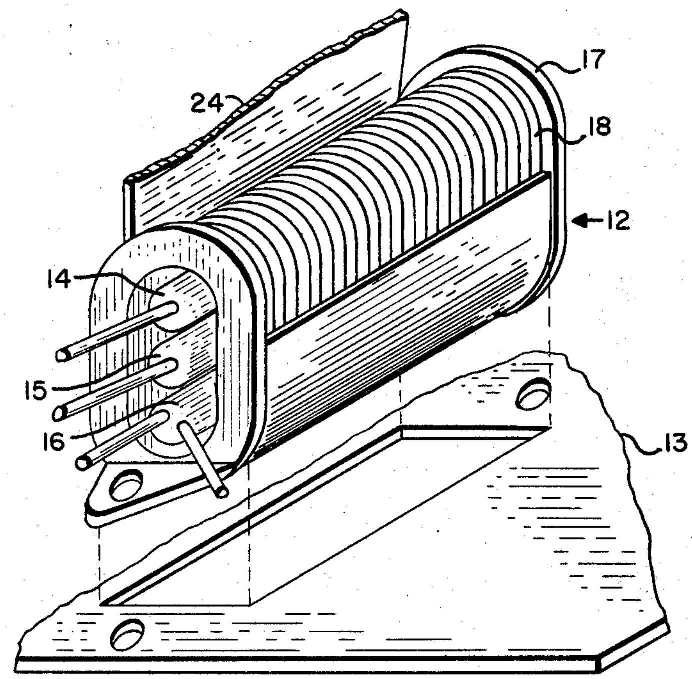
FIGURE 1 is a diagram of a relay constructed as a logic element in accordance with the invention.

In FIGURE 1 a packaged logic element 12 is shown as adapted to fit in an apertured panel 13. The element has an overall length of less than one and one-half inch, and comprises up to three hermetically sealed magnetic reed switches 14, 15, 16 mounted inside a laminated plastic shell 17. A coil 18 is provided to produce a magnetic field for operating any one or more of the integrally inserted magnetic reed switches 14, 15, 16. The coil 18 may comprise 3000 turns of #42 wire for example, which results in a coil resistance of about 500Ω. The coil is wrapped on the outside with a thin magnetic steel tape 24 to provide a magnetic "core" for the coil. Exernal leads are available from the coil and switches for appropriate circuit connections. Constructed in this manner, a relay may operate within one millisecond.

Figure 2:
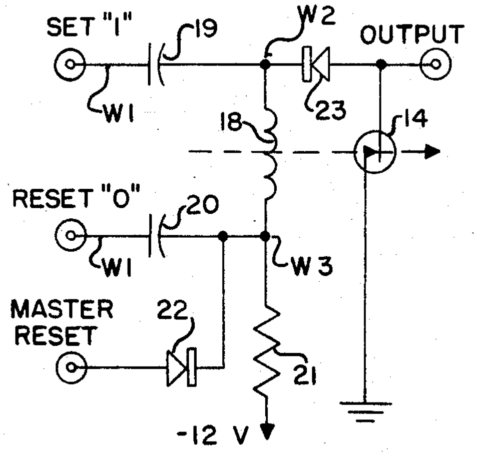
FIGURE 2 is a basic schematic circuit configuration of the logic element.

FIGURE 2 is a basic flip-flop circuit configuration using the logical element of this invention. The dotted arrow indicates operation of reed switch contacts 14 by coil 18 to close the contacts. Thus, the relay circuit is shown in the energized condition with contacts 14 closed.

The relay may be operated by momentary voltage pulses of one millisecond or greater duration introduced by grounding the set, reset or master reset terminals. Capacitors 19 and 20 serve to convey a momentary current flow derived from the −12 volts supply source through respectively the coil 18 and resistor 21 or the resistor 21 alone. Assume that the set terminal is momentarily grounded causing current to flow through coil 18. This closes reed switch 14 to ground and locks the coil 18 into the circuit through resistor 21 to the supply source. Resistor 21 may have the same resistance as the coil 18, namely 500Ω.

To reset the circuit to zero, a switch closure to ground is transitted to the junction between resistor 21 and coil 18 by capacitor 20. This differentiated pulse interrupts current through coil 18 and permits reed switch 14 to open. The output level in respective states serves to provide closed and opened conductive paths which can serve to drive about twenty further elements reliably and without amplification, when using very low inertia magnetic reed switch contacts closing in the order of one millisecond.

A master reset bus is connected by isolating diode 22 to the reset junction, so that a large number of elements in a logic system may be reset at one time by a switch closure to ground at the master reset bus. Diode 23, which along with diode 22 is a temperature insensitive, low forward impedance, silicon diode, serves to isolate the coil 18 and the −12 volts supply source from the output circuits connected to reed switch contacts 14.

Figure 3:
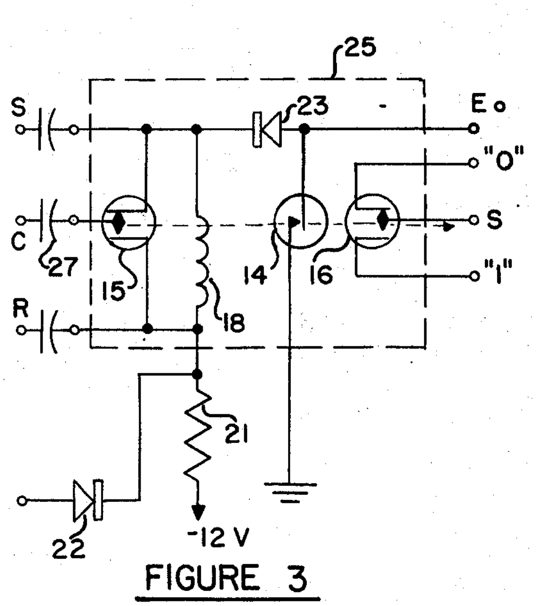
FIGURE 3 is a schematic diagram illustrating a universal logic element.

For more general purpose application, the universal configuration 25 of FIGURE 3 is useful. This includes additionally an input steering reed switch 15 and an output steering reed switch 16. Thus, a complement terminal C is provided which permits an input pulse steered through reed switch 15 and capacitor 27 to change the state in which the flip-flop resides. Consider the unenergized condition of the contacts as shown (the reset state "0"), where the complementing pulse serves to set the circuit by energizing coil 18 and locking in holding reed contact switch 14 to set condition "1." At that time, also reed switch 15 changes position so that the next complementing pulse would be directed to the reset junction of coil 18 and resistor 21 to return the circuit to reset condition. Similarly, output steering contacts 16 can direct a steering command S to appropriate circuits in the "0" or "1" state.

Figures 4, 5:
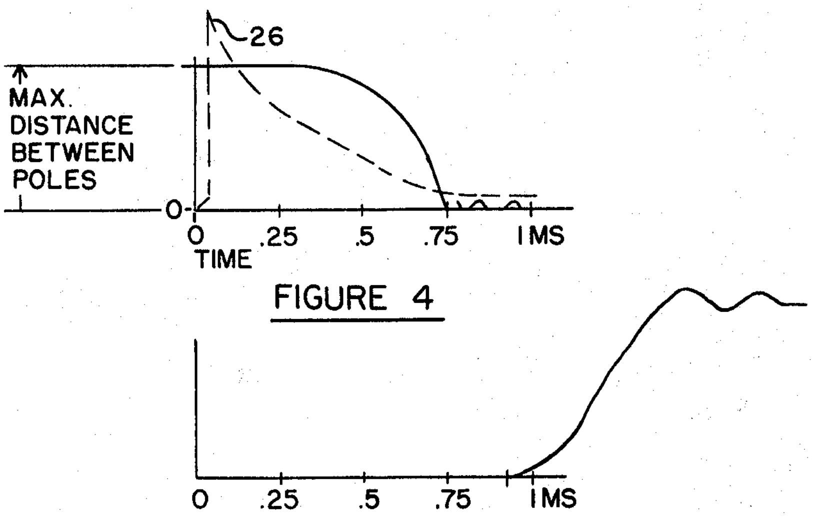
FIGURES 4 to 6 are waveform diagrams illustrating operational principles of the logic element.

In order to appreciate basic operation of the logic element, the operating characteristics of the relay should be considered. By coil design, the time it takes to close the relay contacts and to open them may be substantially equalized. This can be done by choosing the proper ratio of resistance of coil 18 to that of resistor 21. A typical delay period is in the order of one millisecond. The graph of FIGURE 4 illustrates a closure operation, where it takes time for the magnetic field to build up to the point it starts moving the switching reeds closer together. In about .75 ms. the contacts close and possibly bounce to a stable condition before 1 ms. has elapsed.

Similarly, to open the closed reed switches a delay takes place as typified in FIGURE 5. The magnetic parts will have a hysteresis or retentivity which will tend to hold the contacts closed after current is removed from the coil so that opening will not occur until after a lapse of about 1 ms.

These delay periods are fully utilized in this invention to avoid use of expensive filtering and circuit delay components. This delay makes the circuit insensitive to noise and accomplishes the delay functions necessary in logical circuits such as complementing flip-flops, shift registers, strobing at clock time, pedestal gating, etc. The delay operation will be discussed more specifically in connection with different circuit embodiments later treated.

If the opening and closing times require a sustained one millisecond pulse, then the presence of short transient voltages of large amplitude can be tolerated without causing erratic logic operation. Thus, the circuits do not require expensive filtering circuits to provide immunity from other circuits or devices which may generate transient noise impulses.

Figure 6:
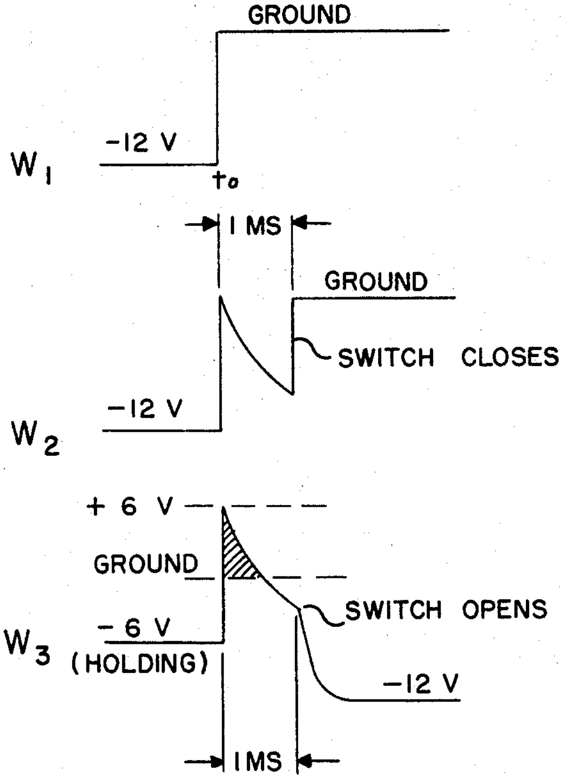

Basic circuit operation waveforms are shown in FIGURE 6, as applied to operation of the circuit of FIGURE 2.

The capacitors 19, 20 serve not only as direct current isolating capacitors but operate with the resistance of coil 18 and resistor 21 as differentiator circuits to produce an input current waveform shape 26 (FIGURE 4). It may be seen that the peak current flows at the time maximum power is required to start the contacts in motion, whereafter not only do they come closer together requiring less magnetic force, but their inertia keeps them moving toward each other. Thus, the expiring current of waveform 26 provides efficient operation of the relay closure. Also, the circuit is not responsive to changes in duration of the pulse if it is greater than the required one millisecond.

Thus, consider the reset differentiating capacitor 20 to be two microfarads and the set capacitor 19 to be one microfarad. Thus, the basic RC discharge time with resistance of 500 ohms for resistor 21 and 500 ohms for coil 81 will be one millisecond in either case. This matches the switching and release times of FIGURES 4 and 5. During recharge of capacitor 19 from the −12 volt source when holding contacts 14 are opened, the current through coil 18 is limited by the resistance of resistor 21 and coil 18 to prevent operation of the switch contacts 14. This occurs simultaneously with the expiration of the reset pulse seen in FIGURE 6 so that in essence both capacitors 19 and 20 charge at the same time to the −12 volt level. Since capacitor 20 is two microfarads, the greater amount of current to it causes a drop across resistor 21 to keep the charge rate through coil 18 low enough to prevent closing contacts 14 again. Thus, the current through coil 18 during recharge of capacitor 19 is not sufficient to disturb the contacts 14. The charging current of capacitor 20 does not flow through coil 18.

The waveform diagrams of FIGURE 6 will illustrate operation. Waveform $W_1$ shows a set input waveform which will be applied to the set terminal when the circuit is in the "0" state to raise the potential from −12 volt to ground at starting time $t_0$. The opposite face of the capacitor 19 is also at −12 volts at $t_0$ because contact 14 is open and no current flows until $t_0$ when ground potential occurs. The instant change of waveform $W_1$ at the set terminal causes waveform $W_2$ to appear at the corresponding point $W_2$ of FIGURE 2. The one millisecond differentiating circuit causes the voltage to decrease up until $t_0$ plus one millisecond. After this, the switch contacts 14 close to hold point $W_2$ at ground potential. The circuit remains in this condition until the holding contact 14 is released.

In this "holding" condition the coil 18 and the resistor 21 act as a voltage divider so that point $W_3$ is at a potential of −6 volt. The corresponding waveform $W_3$ when indicates the reset action which opens contacts 14 as the waveform $W_1$ is applied to the reset terminal. A twelve volt pulse is passed by the reset capacitor 20 to cause the voltage to go temporarily to a +6 volt peak. When the coil passes zero voltage, the voltage reverses tending to cause the contacts 14 to open. This reverses the holding magnetism and causes the switch to be opened quickly. Thus, in one millisecond after $t_0$, with the voltage returning almost to the −6 volt level, the contacts open. Thereupon the reset capacitor will be recharged to −12 volts through resistor 21. A significant part of this operation is the polarity reversal, which causes the contacts to be opened. This reset operation is quite significant, since standard pulses are provided for all logic operations, yet the relay contacts are opened much faster than normally when the relay is de-energized, because the magnetizing field is reversed in polarity, which quickly removes any magnetic hysteresis in the reed elements.

Figure 7:
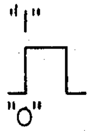
FIGURE 7 is a chart of the basic logic rules used in accordance with the invention.

Significantly the time delay of one millisecond during opening and closing of the contacts is an important part of the logical operation of this novel logic element. In order to prevent confusion in discussing the logical applications exemplifying use of this delay period, the logic rules are charted in FIGURE 7. It is seen that for flip-flop or static condition ground level is the logical "1" and −12 volts is the logical "0." A momentary pulse is used for transferring, triggering, setting and resetting with a change from −12 volts to ground. This pulse for the described relay operation has a duration of one millisecond for counting, shifting or presetting.

Figure 8:
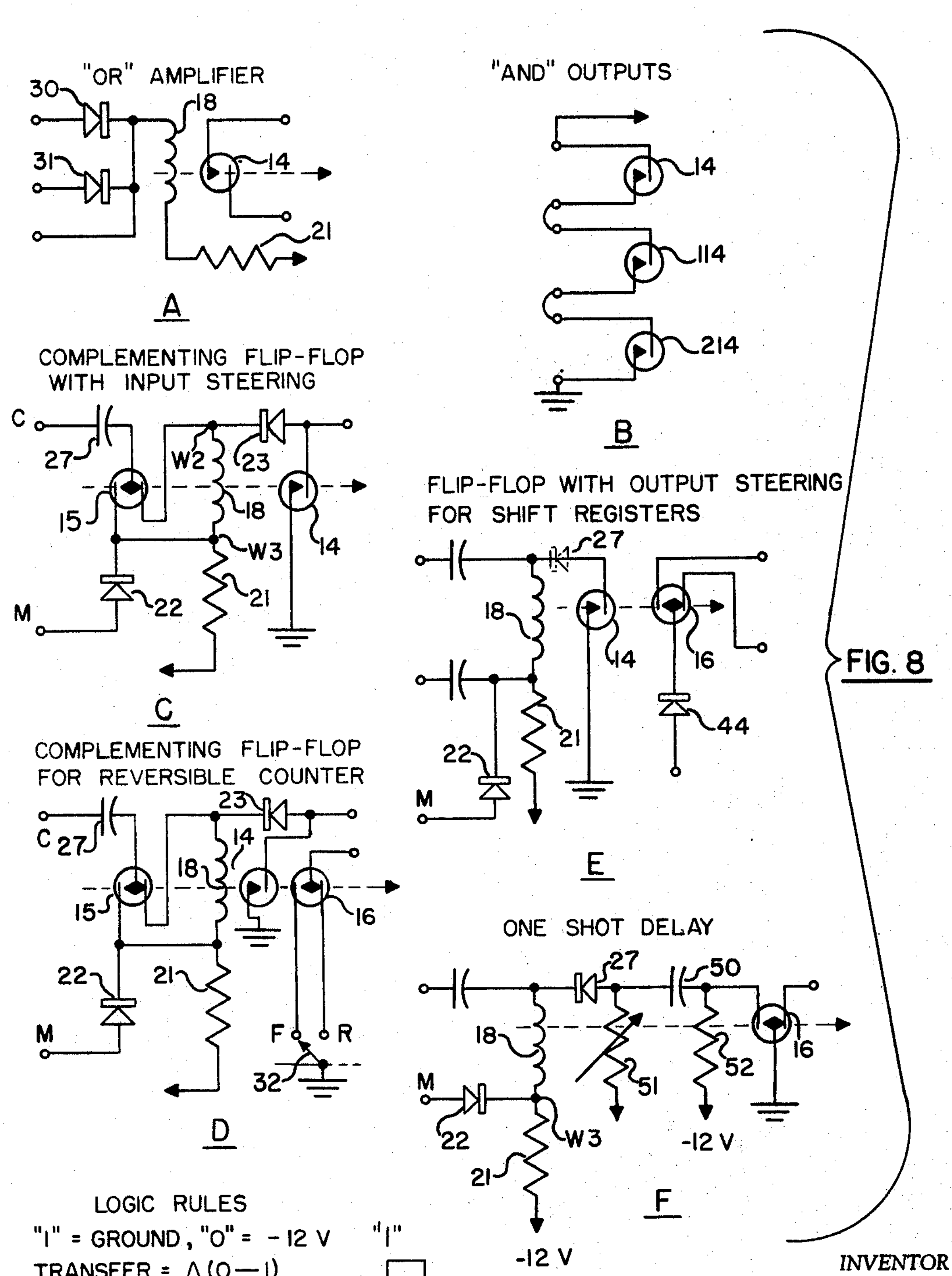

In FIGURE 8, various sorts of logical operations are exemplified. FIGURE 8A shows the "OR" amplifier function. Here coil 18 can be energized from a plurality of input sources. Diodes 30, 31 are high temperature silicon diodes, which are used when isolation of the input circuit is required.

FIGURE 8B illustrates serially connected contact sets 14, 114, 214 of several logical elements, which provide a "1" when all contacts are closed, thus performing the logical "AND" function.

Complementing flip-flop action is performed simply by this novel logical element in the manner shown in FIGURE 8C. The use of the input steering contacts 15 suffice for the binary counting, and serve to extremely simplify this logical function when performed with a relay by using the one millisecond delay time afforded in opening and closing the relay contacts. Thus, a momentary pulse at the complementing input terminal C can be applied to point $W_2$ and the coil 18 through steering contact 15 before a change of position of the steering contacts by coil 18.

As before described, the differentiated pulse gets the contacts moving so they are closed by the inertia action and need not have the tail end of the differentiated pulse (26, FIGURE 4) used to complete the switching action. Contacts 14 then lock the circuit into set "1" position and transfer steering contacts 15 to point $W_3$ for the next complementing pulse. It is of significance also that the differentiated pulse is used, since it has almost expired after the contacts switch and thus, any transfer of energy in the complementing capacitor 27 will not seriously affect point $W_3$. Essentially, therefore, the logical element serves as a pedestal gate and time delay, so that only the steering contacts 15 are required for permitting the complementing of the basic flip-flop storage device.

The simplicity of circuits requiring multiple flip-flops per stage, etc. in a binary counter circuit can be seen by consideration of the circuit of FIGURE 9. Here, blocks 25, 125, etc., indicate a basic logical element such as shown in FIGURE 3, in each counter stage. Variations of circuit details are not noted, for example, since in simplest form of binary counter application, some of the components of the universal element may be omitted where not used, and if shown, would add unnecessarily to complexity of the drawing to detract from the showing of simplicity of circuits using the novel logical element of this invention. Since contacts 16, 116, etc. are drawn outside the logical blocks for convenience, dotted lines are introduced to show the ganged operation with the other contacts operated by coil 18.

Output signals for this parallel binary counter are taken from the switch contacts 14, 114, etc. to form an output binary word *abcd* at corresponding output terminals. Also these terminals may be used to preset the counter. Master reset pulses through diode 22, 122, etc. will serve to clear all stages to "0" at the same time.

Momentary count input signals are applied to the count input bus and are conveyed in accordance with the state of the individual counter stages 25, 125 etc. by means of contacts 16, 116, etc. Thus, these contacts direct the transfer of counts within the counter from stage to stage. Assume the count in the counter *abcd*=1101 as the illustrated state of the contacts indicated. After a count is applied, the result should be *abcd*=0011 if *a* is the least significant bit. The operation of the circuit is as follows. The input pulse at steering contacts 15 cause *a* to be reset to 0. But before this happens (after one millisecond) the count pulse is gated through contact 16 to stage *b* which is also set to 0 through steering contacts 115. Similarly, stage *c* is set to 1 through contacts 116 and 215. Stage *d* remains in 1 state because of open contact 216 which does not close until expiration of the one millisecond count pulse. Thus, *abcd*=0011. This operation shows the value of the pedestal gating or delay function of the logic element in simplifying a complex logical function of binary counting.

In FIGURE 8D a similar complementing flip-flop is shown as connected for reversible counting. In this case, the transfer type output steering switch 16 is used to supplement the single closure switch 14. This in essence serves to supply outputs on "1" when switch 32 couples in the normally open contact to ground in the forward carry direction. In the reverse carry condition the output lead is grounded in the normal (unenergized) position of output steering contacts 16, thereby providing an output for "0."

The complete counter circuit is illustrated in FIGURE 10. Basically, this is a ripple carry type counter which has interstage coupling from each logical flip-flop unit 25, 125, etc., by way of contacts 16, etc. Output leads *abcd* derive binary bits 1101 from magnetic reed switch contacts 14, 114, etc., as shown in the drawing. Also a resistor 33, 133, etc. is added in each stage to permit reverse counting. These resistors recharge the input capacitors to −12 volts when not grounded by a switch. This permits the input circuit to change from −12 volts to ground responsive to steering contacts 16.

In the condition *abcd*=1101, the momentary count pulse at the input terminal will complement stage 25 changing output *a* from 1 to 0 after one millisecond. Resistor 133 holds the input to capacitor 127 at −12 volts so that grounding by switch 16 results in a complement input signal. This occurs in a ripple fashion from stage to stage at one millisecond intervals for example, all contacts of coil 18 change to switch stage 125 to a "0" state after the first millisecond. This in turn, after another millisecond wait, switches stage 225 to its "1" state. However, since reverse bus 35 is not grounded and furthermore, because the input lead to stage 325 is already at ground, no transfer condition ("0" to "1" or −12 volts to ground) is applied and stage 325 remains in its "1" state. Thus, the result of one count gives the proper *abcd*=0011, where *a* is the least significant digit.

Coil 18′ may be used with contacts 32 as a direction switch as part of a universal flip-flop. This then can be pulsed to change the counter for reverse counting. With the same conditions *abcd*=1101, consider the operation in reverse. When reversing, a transfer results on "0" rather than "1." Thus, reverse bus 35 grounds the succeeding stage when contact 14, 114, etc., is going from "1" to "0" by way of output steering contacts 16, 116, etc.

Now with an input level change from −12 volts to ground which will signify a reverse count, the circuit can be viewed in operation. Note that closure of switches 16 at all times in ground condition for the input of the next stage do not deter the switching action, which can result from either one millisecond pulses or continuing step waveforms.

In reverse counting the first stage 25 will be complemented through steering contacts 15 to return the output *a* to "0." This will remove the ground (reverse bus 25) from the input capacitor 127 of the next stage and cause no further signals to be transferred. The resulting *abcd*=0101 is the proper result. Although this happens in one millisecond, the maximum count time to be allocated for the ripple carry is one millisecond per stage or four milliseconds for the circuit shown, since it is possible that all stages in the chain need be switched in sequence by ripple action.

A further application of this type of counter is illustrated in the binary coded decimal counter embodiment of FIGURE 11. As in usual counters of this type, a feedback connection is used to reset the counter from a weighted binary count representing decimal 9 to a decimal zero. Consider the binary weighting to be 1–2–4–8 and the feedback contact 116′ to provide reset to zero and a carry pulse under conditions where stage 125′ is switched to "1" while stage 325′ is in its "1" state for a decimal count of ten. The feedback contact 116′ provides a carry output signal of one millisecond duration to the succeeding stage.

Assume for considering operation that the count *abcd*=1001 (decimal 9) with the position of the contacts shown accordingly. The input count complements stage 25′ causing output switch 16 to switch stage 125 to its "1" state on the ripple carry. Thus, contact 116′ also closes and since stage 325′ in its "1" state has contact 314 closed, a carry is generated when contact 116′ is closed. Accordingly, the reset bus is grounded causing all the "1" stages to go to their "0" state. This results in *abcd*=0000 and a carry output pulse of one millisecond while contacts 116′ are waiting to be opened. This reset operation typifies the extreme simplicity of complex logic functions afforded by use of the novel logic element. Thus, contact 116′ alone is closed and seems to amplify itself enough to switch itself and other stages off without stutter or intermediate flip-flops or artificial delay lines. This is done because the signal transmitted by closure of contact 116′ to the master reset bus must await the one millisecond opening time of the relay from coil 118, and does not operate instantaneously or cause time races of relay contacts performing other logical functions.

Returning now to FIGURE 8E, the slightly revised form of circuit connection of the logical element is suitable for the complex logical functions required in shift registers. The circuit embodiment of FIGURE 12 illustrates a presettable shift register using this circuit. Note the diode 27 is in phantom, since it need only be used where there is a possibility of sneak circuits. In the presettable shift register wheer output terminals *abc* are connected to the contacts 14, 114, etc., the diodes are used to isolate the output circuits (not shown).

Assume that the preset switches 40, 140, 240 are used to set the register into condition *abc*=101. The contacts are drawn in such position. Now one millisecond advance pulses on bus 41 from switch 42 will serve to shift this information along the register. Resistor 43 normally holds the bus 41 at −12 volts. In stage 25 reset diode 44′ will return the "1" state to "0" state, but before this happens, reset diode 44, through steering contacts 16, set stage 125″ into the "1" state (or permit it to remain there if not "0"). Similarly, stage 225″ will read out a "1" pulse at the set one terminal for operating the succeeding stage or other output circuit. Stage 125″ which is set to "1" but has a "0" state when the transfer pulse arrives causes stage 225″ to be set to "0" state through steering contacts 116. Thus, *abc* is shifted from 101 to 010 (and a "1" output). This operation provides a shift register with a single relay per stage, possible because of the logical behaviour of the novel logic element afforded by the invention.

Another very complex logical function is that of the multivibrator or one shot delay which provides an output pulse, then returns to await a further trigger. The circuit for this is shown in FIGURE 8F. In essence, the output steering contacts 16 are used to produce contact dropout by producing only a temporary holding current as capacitor 50 is discharged through variable resistor 51 to produce a selected duration period. Resistor 52 charges capacitor 50 to −12 volts before the steering contact 16 goes to ground.

Thus, in operation, an input trigger pulse is applied to coil 18 to cause the contacts 16′ to change position after the usual one millisecond delay. This serves to temporarily hold the contacts closed while current is passed by capacitor 50. Before the expiration of this current, resistor 51 is high enough from the charge of capacitor 50 from the contact 16 that coil 18 is not deenergized and will hold its contacts for a time duration determined by the capacitor 50. The potential at the resistor 51 terminal might be −7 volts, for example, for minimum holding current through coil 18, near the termination of the current through capacitor 50.

As the pulse through capacitor 50 expires, the contacts 16′ then return to the output position to provide a delayed shift from "0" to "1" at two milliseconds or more from the time $t_0$ of the initial change $t_0$ of the input trigger pulse.

In essence, this invention as described provides for a novel method of operating a relay so that it may become a logical element. Thus, the inherent time delay period of contact closure and opening is utilized as a logic delay by pulsing the relay with a differentiated pulse having a time duration substantially equal to the contact closure period. This permits the circuit to be instructed with a change signal while it is still holding the prior state and operating logical circuits accordingly. Thus, output circuits may be operated in one mode of operation during the time delay period of contact closure and in a further mode of operation responsive to the change of state of the relay at the end of the closure (or opening) period. Accordingly, the single operating pulse need not be gated, timed or reshaped externally.

As seen in the circuits described, this results in the simplification of complex logic circuits such as shift registers and complementing flip-flops which utilize sequential logic instructions on command during the contact delay period and after a change of state.

It is evident from the specific embodiments illustrated that the novel logical element provides improved comprehensive performance and provides simplified logical circuits of various sorts. The logical elements are restricted only in speed of operation, being somewhat slower than semiconductor logic, but are inexpensive and reliable while offering significant advantages in power or current carrying capacities, the ability to parallel a large number of circuits, lack of response to noise, and the static output condition of contacts which can be probed at any time. The relationship of the elements in cooperation in a system permits circuit economy and the lack of extra logical functions increases reliability by reducing chances of failure or erratic operation. To assure an understanding of claim language it must be recalled that the coil can be energized or de-energized, and the contact motion will be delayed. However, transient conditions are not defined, but the ultimate position of the contacts are used, unless clearly distinguished otherwise. Should this simplification not be used, the details of the claims would be lost in an exhaustive definition of the various stages of operation.

Novel logic contributions descriptive of this invention and its nature are defined with particularity in the following claims.

I claim:

1. An electronic logic element comprising in combination, a coil, at least one set of magnetic reed contacts positioned for operation from said coil, a pair of terminals for connecting a power source to the element, a resistor coupling the coil to one terminal, a normally open reed contact set coupled to the other terminal and the coil as the sole means to couple the coil to the power source responsive to energization of the coil, a first capacitor coupled to the junction of the resistor and the coil to provide a first input circuit, and a second capacitor coupled to the junction of the coil and the reed contact to provide a second input circuit, whereby switching pulses at the first input circuit pass through the capacitor to energize the coil to close the normally open reed contact to energize the coil and switching pulses at the second input circuit pass through the capacitor to de-energize the coil and permit the reed contacts coupled to said other terminal to open.

2. A logical element comprising a relay with a coil and having a normally open holding contact coupled for holding the coil in energized condition, a power source terminal, a resistor coupled between the relay and the power source terminal, a circuit for continuously energizing said coil solely from said power source terminal by a circuit through said holding contact, and two input circuit capacitors coupled respectively at opposite ends of the coil for momentarily coupling a trigger source for respectively closing and opening said holding contacts.

3. A logical element as defined in claim 2, wherein said coil has a finite resistance, at least one set of contacts operable by said coil, a voltage reducing element coupling the coil to the source, and said capacitors coupled to both terminals of the coil are of such value that switching pulses through the capacitors are differentiated.

4. A logical element as defined in claim 3, wherein the differentiating time constant of each capacitor and associated circuit is substantially identical.

5. A logical element as defined in claim 3, wherein the coil and contacts are designed to have substantially equal closing and opening delay periods responsive to similar input switching signals at the respective capacitors.

6. A logical element comprising in combination, a relay coil, a resistor coupled in series with said coil, at least one set of contacts operable by said coil, a selectively operable circuit including a capacitor coupled to respective ends of said coil, means to provide switching impulses through the capacitors to opposite ends of said coil for respectively opening and closing said contacts, and direct current means as sole maintaining energization energy for said coil connected thereto by a circuit passing through said contacts.

7. A logical element as defined in claim 6, wherein the resistor and coil are so proportioned to provide substantially equal contact closure and release time periods.

8. A logical element as defined in claim 7, wherein the capacitor with the resistance of the coil and resistor differentiates input pulses with a time constant substantially equal to the contact closure time.

9. A logical element as defined in claim 6, wherein the set of contacts constitutes magnetic reeds.

10. A logical element as defined in claim 7, wherein a supply source is provided, and the contacts connect the coil and resistor combination to the supply source when operated by said coil.

11. An element as defined in claim 10, including a second capacitor circuit coupled between the coil and the resistor to provide switching impulses for releasing the last said contacts by decoupling the source from said coil.

12. A logical element as defined in claim 11, wherein the two capacitors comprise differentiating circuits having respective time constants substantially equal to the closing and release times of the contacts.

13. A logical element as defined in claim 10, wherein a further set of contacts comprising transfer contacts is operated by the coil, and the transfer contacts are coupled to disconnect the capacitor from one end of the coil and connect it across the resistor when the coil is energized.

14. A plurality of elements as defined in claim 13, each having an output connection provided at a set of output contacts, and an input connection at the transfer contacts of said further set, thereby constituting a binary counter.

15. The combination defined in claim 14, wherein the set of output contacts is said first mentioned set of contacts, thereby constituting a ripple carry type of counter.

16. The combination defined in claim 15, wherein the first mentioned set of contacts is of the transfer type, and the connection to the power source is alternately established in the energized and unenergized condition of the coil by the last said transfer contacts, and a power source connection to a selected one of the last said transfer contact positions whereby the counter can count up or count down respectively.

17. An element as defined in claim 11, wherein a further set of contacts comprising transfer contacts is operated by said coil, and an output circuit is connected to the further set of contacts to receive a signal on different transfer contacts as the coil is energized and de-energized.

18. A plurality of elements as defined in claim 17, wherein the transfer contacts are coupled from each stage to a successive stage at the two input capacitors to energize the coil of the succeeding stage when the coil of the preceding stage is energized, and external switching means coupled to the transfer contacts to provide switching pulses therethrough, thereby producing a shift register where information is advanced from stage to stage upon command of the external switching means.

19. An element as defined in claim 10, wherein the coupling of the source to the coil is through a capacitor to provide a pulse which energizes the coil when the coil is operated, thereby permitting the coil to become de-energized at the end of the pulse providing a pulsed output substantially a function in time duration of the contact closure time period.

References Cited

UNITED STATES PATENTS

| | | | |
|---|---|---|---|
| 2,914,749 | 11/1959 | Vande Sande et al. | 340—168 |
| 3,028,084 | 4/1962 | Wetherill | 235—92 |
| 3,042,900 | 7/1962 | Werts | 340—168 |
| 3,121,827 | 2/1964 | Arnold | 137—140 |
| 3,230,383 | 1/1966 | MacArthur | 307—38 |
| 3,244,942 | 4/1966 | Deeg | 317—137 |

JOHN S. HEYMAN, *Primary Examiner.*

ARTHUR GAUSS, *Examiner.*

R. H. PLOTKIN, *Assistant Examiner.*